(12) United States Patent
Nichols et al.

(10) Patent No.: US 11,543,477 B2
(45) Date of Patent: Jan. 3, 2023

(54) MAGNETIC RESONANCE DETECTION (MRD) SYSTEM FOR AND METHODS OF DETECTING AND CLASSIFYING MULTIPLE CHEMICAL SUBSTANCES

(71) Applicant: Vadum, Inc., Raleigh, NC (US)

(72) Inventors: Todd Nichols, Cary, NC (US); Shaun M. Gidcumb, Raleigh, NC (US); Thomas Ketterl, Chapel Hill, NC (US); Gregory T. Brauns, Raleigh, NC (US); Eric Phillips, Raleigh, NC (US)

(73) Assignee: Vadum, Inc., Raleigh, NC (US)

( * ) Notice: Subject to any disclaimer, the term of this patent is extended or adjusted under 35 U.S.C. 154(b) by 329 days.

(21) Appl. No.: 16/849,510

(22) Filed: Apr. 15, 2020

(65) Prior Publication Data
US 2020/0333412 A1    Oct. 22, 2020

Related U.S. Application Data

(60) Provisional application No. 62/834,789, filed on Apr. 16, 2019.

(51) Int. Cl.
*G01R 33/44* (2006.01)
*G01R 33/36* (2006.01)

(52) U.S. Cl.
CPC ....... *G01R 33/441* (2013.01); *G01R 33/3664* (2013.01)

(58) Field of Classification Search
CPC .............. G01R 33/441; G01R 33/3664; G01R 33/341; G01R 33/3614; G01R 33/3635;
(Continued)

(56) References Cited

U.S. PATENT DOCUMENTS

| 4,992,736 A * | 2/1991 | Stormont | G01R 33/3678 324/309 |
| 5,898,306 A * | 4/1999 | Liu | G01R 33/3678 324/318 |

(Continued)

OTHER PUBLICATIONS

Michal, Carl A., Kesten Broughton, and Elsa Hansen. "A high performance digital receiver for home-built nuclear magnetic resonance spectrometers." Review of scientific instruments 73.2 (2002): 453-458. (Year: 2002).*

(Continued)

*Primary Examiner* — Christopher P McAndrew
(74) *Attorney, Agent, or Firm* — Murphy, Bilak & Homiller, PLLC

(57) ABSTRACT

A magnetic resonance detection (MRD) system for and methods of detecting and classifying multiple chemical substances is disclosed. In one example, the presently disclosed MRD system is a nuclear quadrupole resonance (NQR) detection system that provides multi-frequency operation for substantially full coverage of the explosive NQR spectrum using a broadband transmit/receive (T/R) switch (or duplexer) and a single multi-frequency radio frequency (RF) transducer. More particularly, the MRD system provides a frequency-agile system that can operate over a wide band of frequencies or wavelengths. Further, a method of detecting and classifying various chemical substances is provided that includes pulse sequencing with "frequency hopping," phase cycling for reducing or substantially eliminating background noise, and/or a process of mitigating amplitude modulation (AM) radio interference.

18 Claims, 12 Drawing Sheets

(58) Field of Classification Search
CPC ............ G01R 33/3671; G01R 33/3678; G01N 24/084
USPC ......................................................... 324/309
See application file for complete search history.

(56) References Cited

U.S. PATENT DOCUMENTS

| | | | | |
|---|---|---|---|---|
| 6,291,994 | B1* | 9/2001 | Kim | G01R 33/441 |
| | | | | 324/318 |
| 6,704,594 | B1* | 3/2004 | Blank | G01R 33/3808 |
| | | | | 600/407 |
| 6,751,272 | B1* | 6/2004 | Burns | H04L 25/063 |
| | | | | 375/259 |
| 7,511,500 | B2* | 3/2009 | Schiano | G01R 33/3671 |
| | | | | 324/318 |
| 9,759,832 | B1* | 9/2017 | Freedman | G01R 33/3664 |
| 2006/0020403 | A1* | 1/2006 | Pusiol | G01F 1/74 |
| | | | | 702/45 |
| 2006/0091883 | A1* | 5/2006 | Mikhaltsevitch | G01R 33/441 |
| | | | | 324/318 |
| 2015/0226821 | A1* | 8/2015 | Zhang | G01R 33/4816 |
| | | | | 324/309 |
| 2017/0219675 | A1* | 8/2017 | Walsh | G01R 33/441 |
| 2017/0315258 | A1* | 11/2017 | Molina | G01R 33/58 |
| 2018/0203080 | A1* | 7/2018 | Acosta | G01R 33/441 |
| 2019/0072506 | A1* | 3/2019 | Mandal | G01N 21/9508 |

OTHER PUBLICATIONS

Rudakov, T. N., and S. N. Shevchenko. "A Modified Method for Measuring the Spin Relaxation in Nuclear Quadrupole Resonance." Instruments and Experimental Techniques 46.3 (2003): 373-375. (Year: 2003).*

Garroway, Allen N. "Solid state NMR, MRI and Sir Peter Mansfield:(1) from broad lines to narrow and back again; and (2) a highly tenuous link to landmine detection." Magnetic Resonance Materials in Physics, Biology and Medicine 9.3 (1999): 103-108. (Year: 1999).*

* cited by examiner

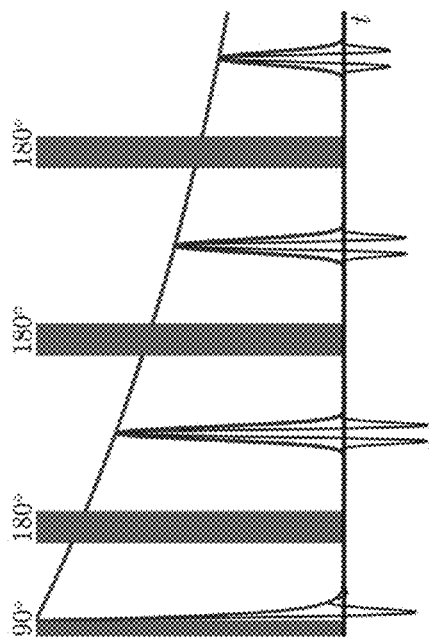
FIG. 10A
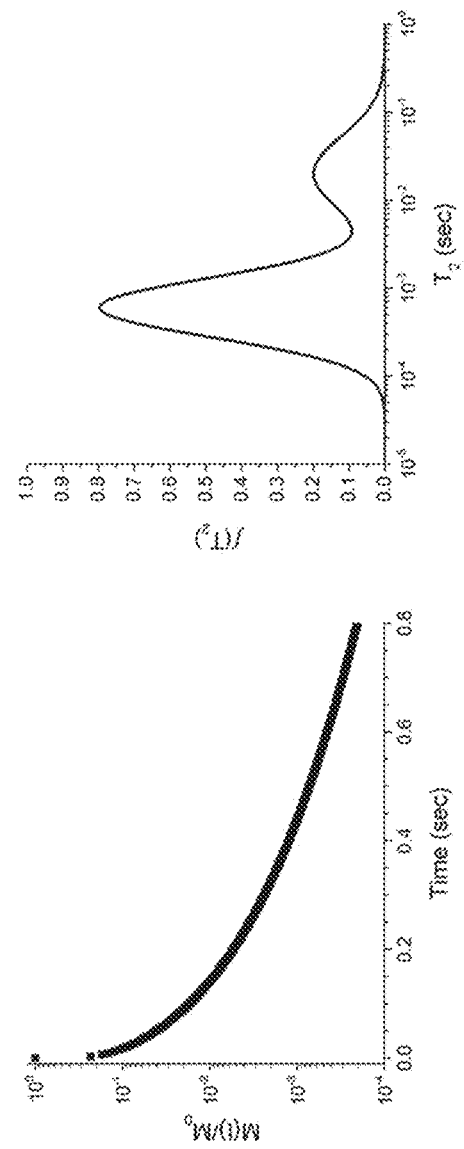
FIG. 10B
FIG. 10C

MAGNETIC RESONANCE DETECTION (MRD) SYSTEM FOR AND METHODS OF DETECTING AND CLASSIFYING MULTIPLE CHEMICAL SUBSTANCES

RELATED APPLICATION

This application claims the benefit of U.S. provisional application Ser. No. 62/834,789, filed 16 Apr. 2019, the entire contents of which are incorporated herein by reference.

TECHNICAL FIELD

The presently disclosed subject matter relates generally to technology for detecting and classifying chemical substances and more particularly to a magnetic resonance detection (MRD) system for and methods of detecting and classifying multiple chemical substances.

BACKGROUND

In military applications, for example, there may be certain drawbacks and/or limitations to current systems and/or devices for detecting explosives. For example, current explosives detection systems and/or devices may be bulky, heavy, and not easily portable. Additionally, current explosives detection systems and/or devices may be very complex and costly. Additionally, current explosives detection systems and/or devices may work poorly from a standoff position for detecting explosive substances that are buried in the ground. Further, current explosives detection systems and/or devices may be limited in the types of substances that can be detected. For example, a particular detection system and/or device may be limited to detecting one type of substance only. Consequently, different detection systems and/or devices may be required to detect different types of substances.

SUMMARY

A magnetic resonance detection (MRD) system for and methods of detecting and classifying multiple chemical substances is disclosed. In one example, the presently disclosed MRD system is a nuclear quadrupole resonance (NQR) detection system that provides multi-frequency operation for substantially full coverage of the explosive NQR spectrum using a broadband transmit/receive (T/R) switch (or duplexer) and a single multi-frequency radio frequency (RF) transducer. More particularly, the MRD system provides a frequency-agile system that can operate over a wide band of frequencies or wavelengths. Further, a method of detecting and classifying various chemical substances is provided that includes pulse sequencing with "frequency hopping," phase cycling for reducing or substantially eliminating background noise, and/or a process of mitigating amplitude modulation (AM) radio interference.

An example magnetic resonance detection apparatus according to some embodiments comprises a frequency-tunable transducer circuit comprising a coil and a tuning network; a transmit/receive switch circuit having a common port coupled to the frequency-tunable transducer circuit and having a multi-octave operating bandwidth; a transmitter circuit coupled to an input port of the transmit/receive switch circuit, the transmitter circuit comprising a power amplifier with a multi-octave operating bandwidth; a digital quadrature receiver circuit coupled to an output port of the transmit/receive switch circuit and having a multi-octave operating bandwidth; a tunable frequency source coupled to the transmitter circuit and to the receiver circuit, the tunable frequency source having a multi-octave operating bandwidth; and a controller circuit configured to control the frequency source, the transmitter circuit, and the transmit/receive switch so as to emit a series of radio-frequency (RF) pulses from the coil and further configured to control the frequency source, the receiver circuit and the transmit/receive switch so as to measure nuclear quadrupole resonance (NQR) responses after each RF pulse. The term "port" as used herein may refer to a single-ended or differential input or output connection to the corresponding circuit.

In some of these and in some other embodiments, a controller circuit is configured to control the frequency source, the transmitter circuit, and the transmit/receive switch so as to emit a series of radio-frequency (RF) pulses comprising a first sequence of pulses at a first phase, the first sequence comprising at least one pulse for each of a plurality of frequencies, and a second sequence of pulses at a second phase, the second sequence comprising at least one pulse for each of the plurality of frequencies, and wherein the controller circuit is further configured to, for each of the plurality of frequencies, coherently add the responses corresponding to the pulses for the respective frequency. In some embodiments, the series may comprise sequences of pulses at third and fourth phases as well, with the respective responses for each frequency also coherently added. These phases may be 0, 90, 180, and 270 degrees, for example.

In some embodiments, the controller circuit is further configured to estimate a longitudinal relaxation time and/or a transverse relaxation time for responses corresponding to at least one RF pulse frequency. In some embodiments, the controller circuit is configured to estimate a longitudinal relaxation time and/or a transverse relaxation time for responses corresponding to each of at least two RF pulse frequencies, and to compare the estimated longitudinal relaxation times and/or transverse relaxation times to each of a plurality of stored patterns, to identify a closest match.

In some embodiments, the frequency-tunable transducer circuit further comprises a Q-spoiling switch having an input coupled to the coil and an output connected to ground, and wherein the controller circuit is further configured to close the Q-spoiling switch for a predetermined time interval between the emitting of each pulse and the subsequent measuring of the response.

In some embodiments, the transmit/receive switch, the transmitter circuit, the digital quadrature receiver circuit, and the frequency source have operating bandwidths spanning at least 500 kHz-4 MHz.

In some embodiments, the magnetic resonance detection apparatus of any of examples 1-6, further comprising one or more RF detectors coupled to the transducer circuit via a directional coupler, and wherein the controller circuit is configured to adjust the tuning network of the frequency-tunable transducer circuit based on outputs of the one or more RF detectors during transmitted pulses.

It will be appreciated that many variations of the above examples are possible, in view of the following detailed description of these embodiments and other features and advantages.

BRIEF DESCRIPTION OF DRAWINGS

Figure 1:
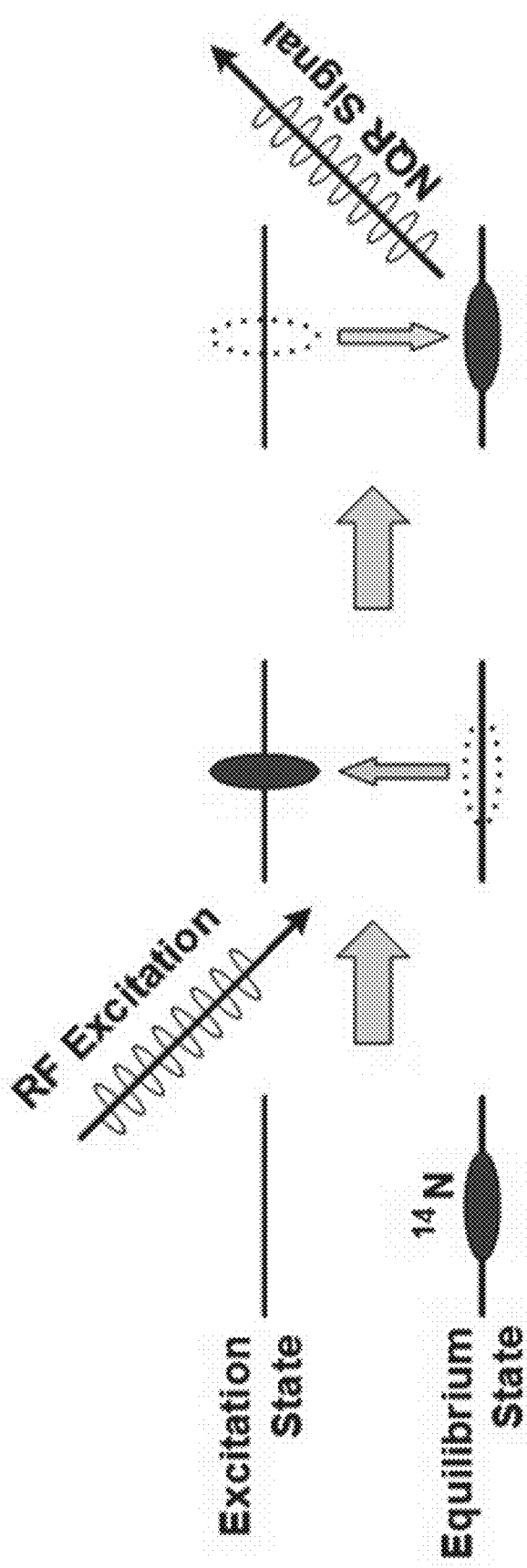

Having thus described the presently disclosed subject matter in general terms, reference will now be made to the accompanying drawings, which are not necessarily drawn to scale, and wherein:

FIG. 1 illustrates nitrogen atom excitation using a nuclear quadrupole resonance (NQR) process.

Figures 2, 3:
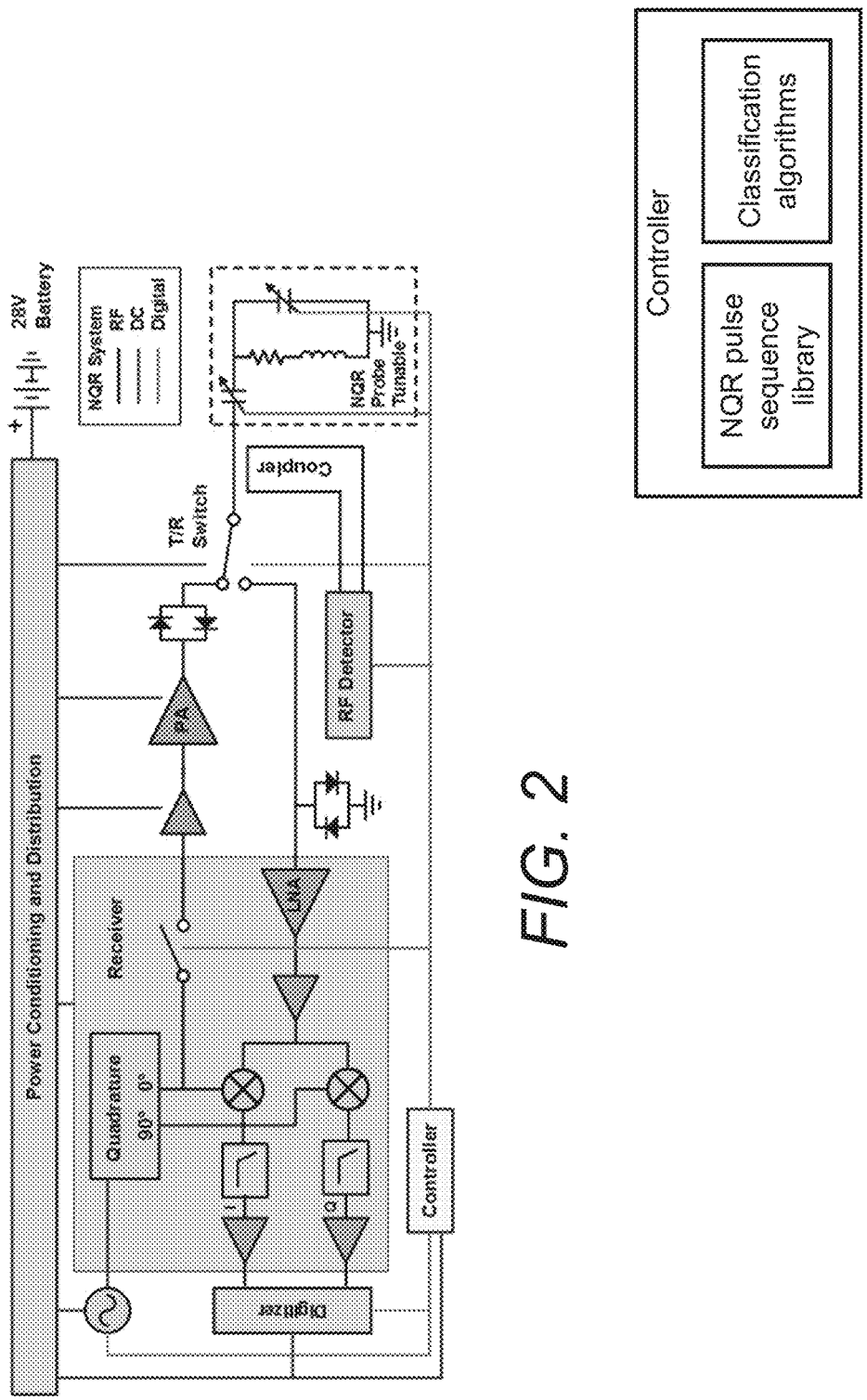

FIG. 2 illustrates a block diagram.

FIG. 3 shows an example of NQR detection software components within a controller device incorporated in the presently disclosed MRD system.

Figure 4:
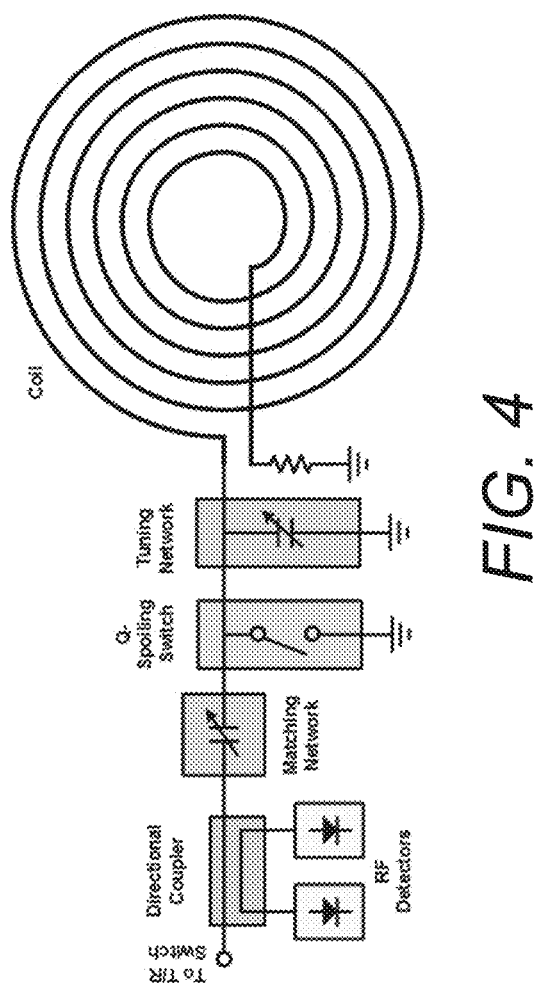

FIG. 4 illustrates a block diagram of an NQR sensor head of the presently disclosed MRD system.

Figure 5B:
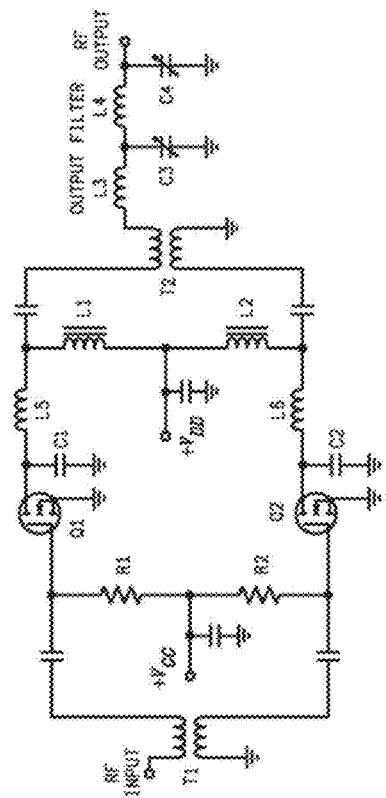
Figure 5A:
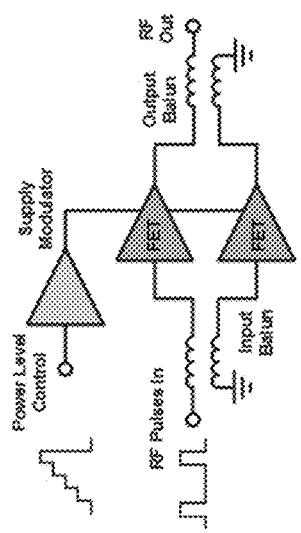

FIG. 5A and FIG. 5B illustrate a block diagram and simplified schematic of a broadband RF power amplifier of the presently disclosed MRD system.

Figures 6A, 6B:
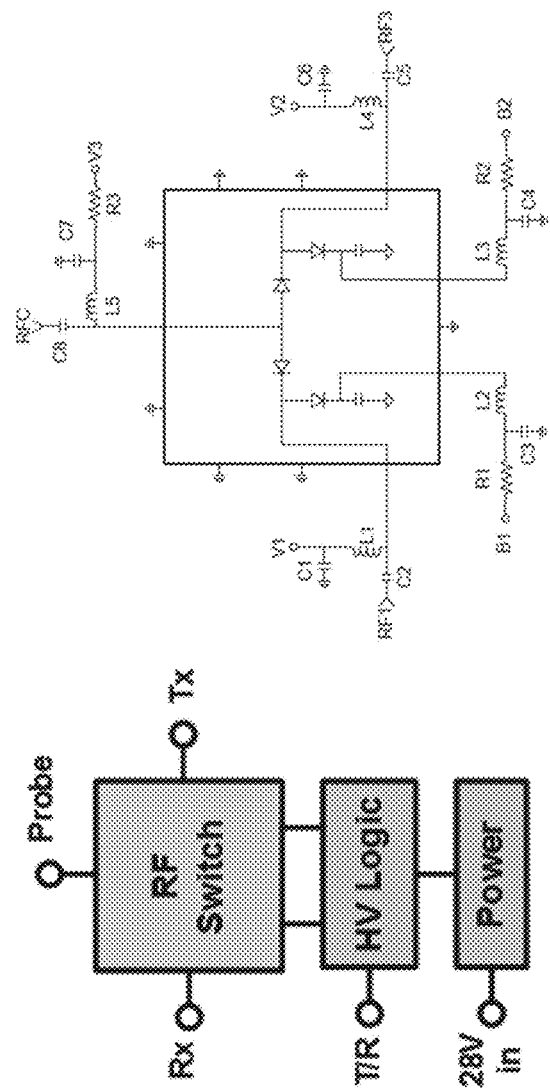

FIG. 6A, FIG. 6B, and FIG. 6C illustrate a block diagram, simplified schematic, and example image of a transmit and receive switch of the presently disclosed MRD system.

Figure 7:
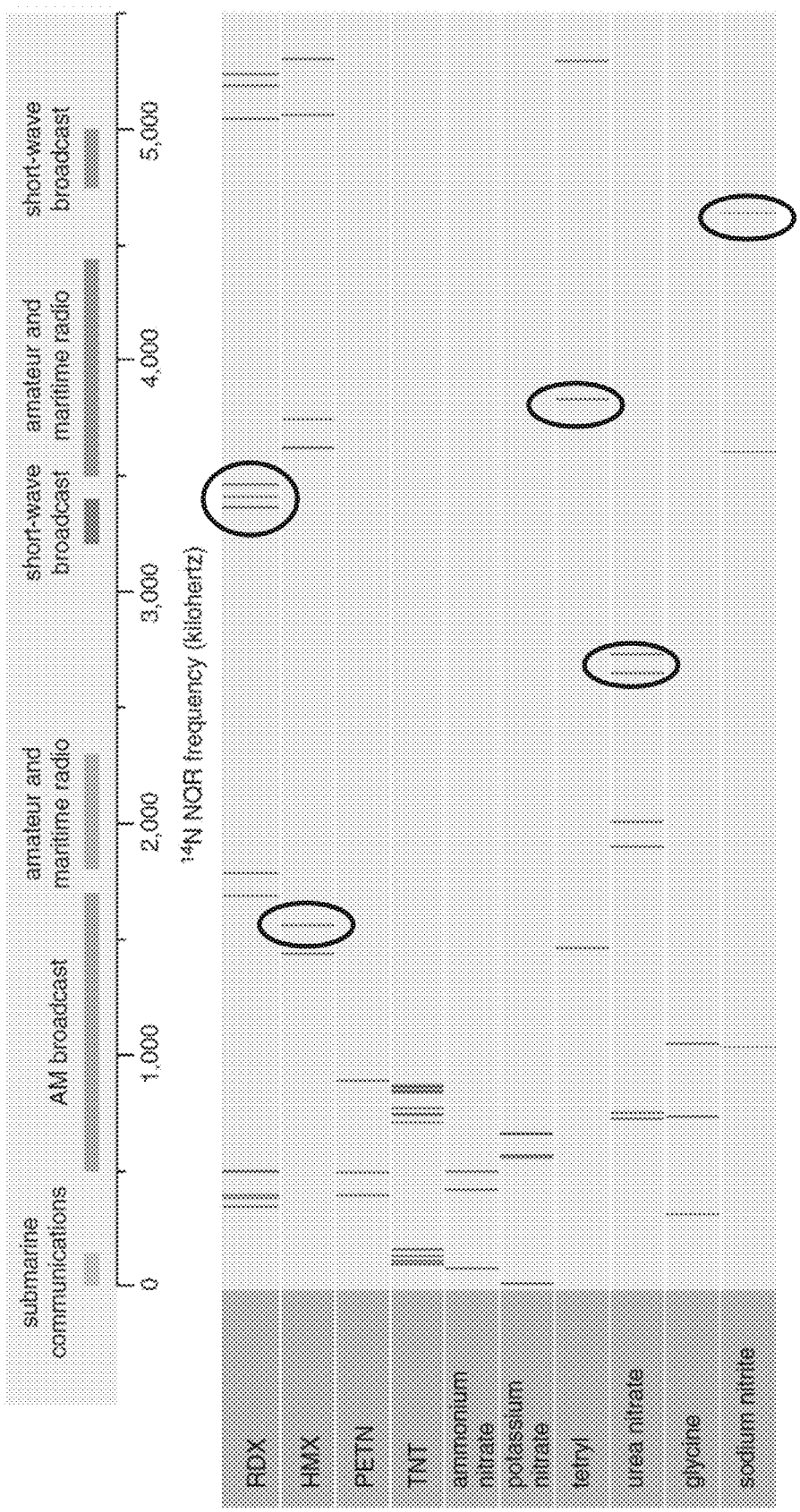

FIG. 7 shows a chart indicating the nuclear quadrupole resonance frequencies of $^{14}N$ explosive substances and five examples of discrete frequencies that independently classify unique explosive substances of the presently disclosed MRD system.

Figure 8:
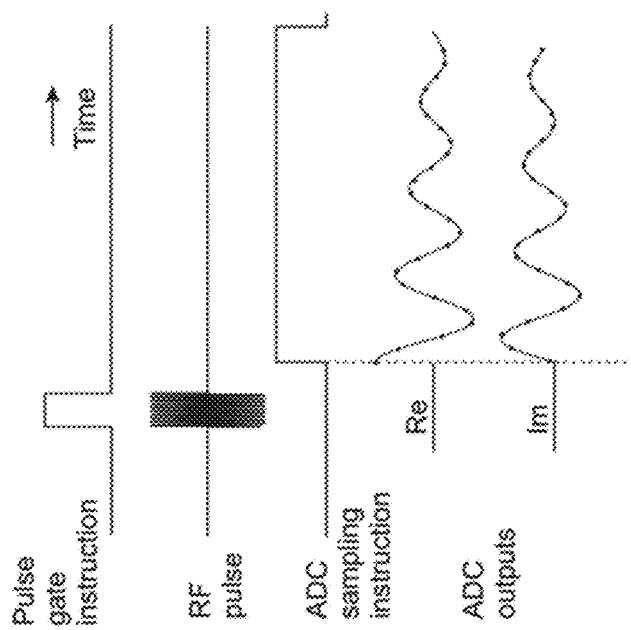

FIG. 8 illustrates an example of the basic transmit and receive timing to sense an NQR response of the presently disclosed MRD system.

Figure 9:
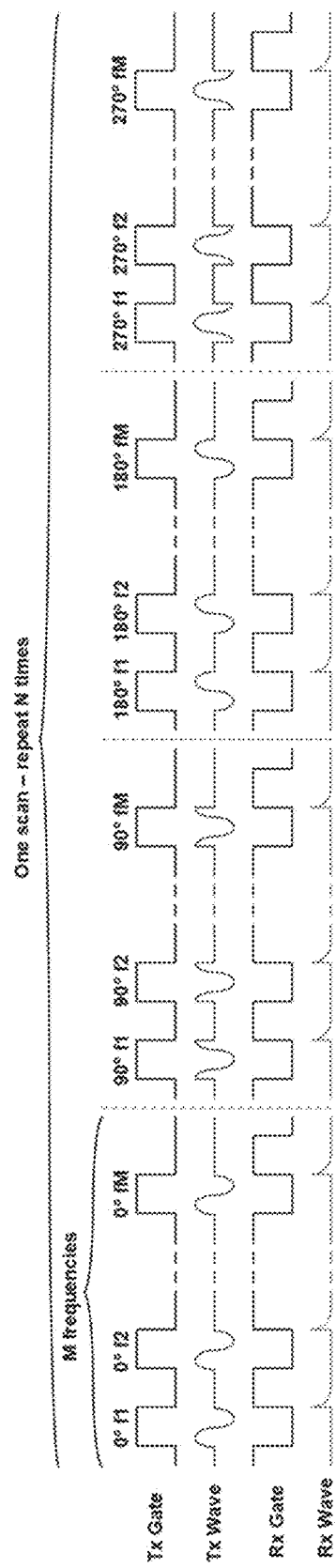

FIG. 9 illustrates an example of a pulse sequence using phase cycling to increase the signal to noise ratio (SNR) and using frequency hopping to interrogate multiple substances simultaneously to decrease dwell time of the presently disclosed MRD system.

FIG. 10A, FIG. 10B, and FIG. 10C show example received signals for measurement of T2 relaxation times for signal processing of the presently disclosed MRD system.

Figure 11B:
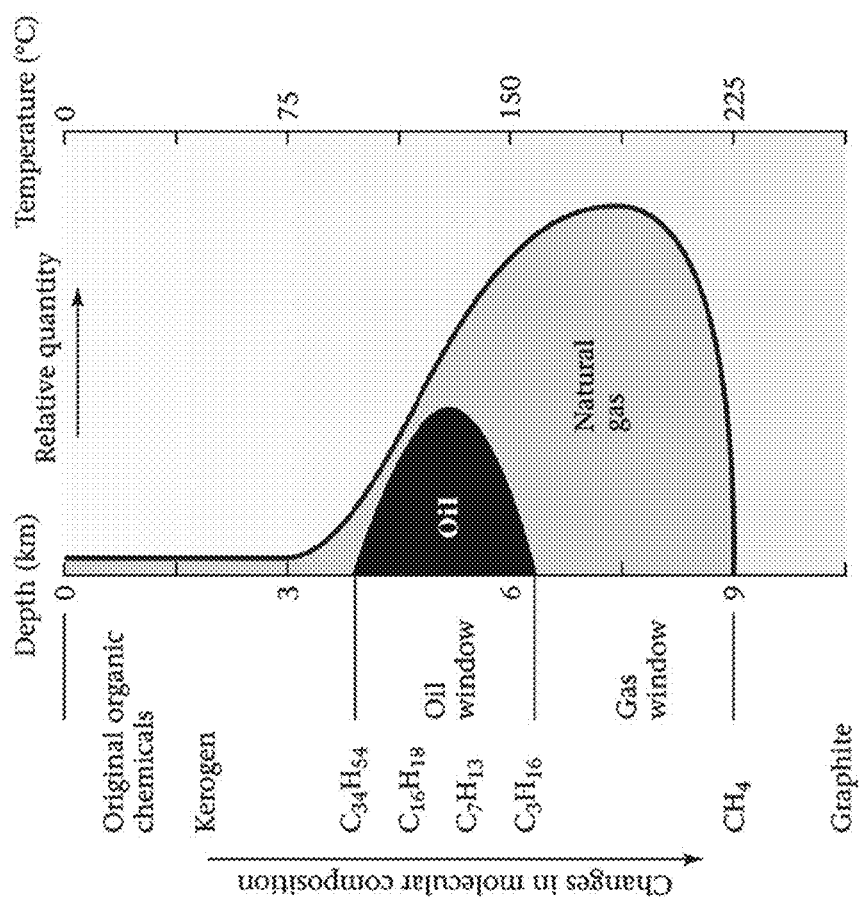
Figure 11A:
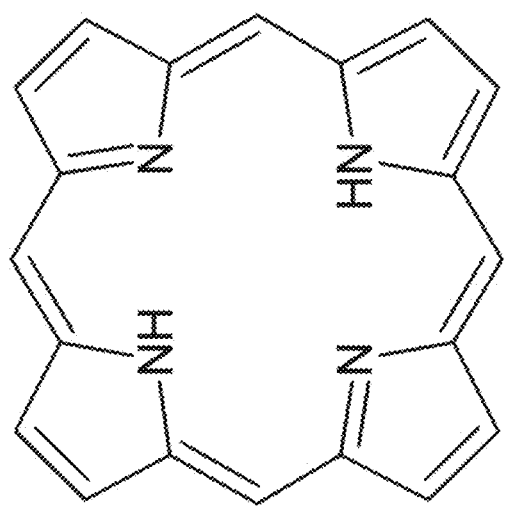

FIG. 11A and FIG. 11B show a kerogen molecule structure present in deep earth core samples for oil and gas industry applications of the presently disclosed MRD system.

Figure 12:
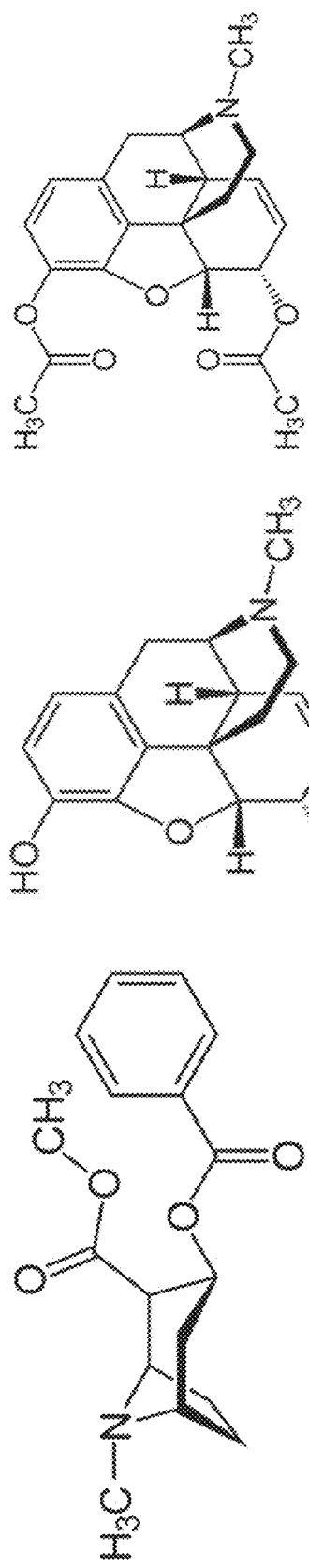
Figure 12:
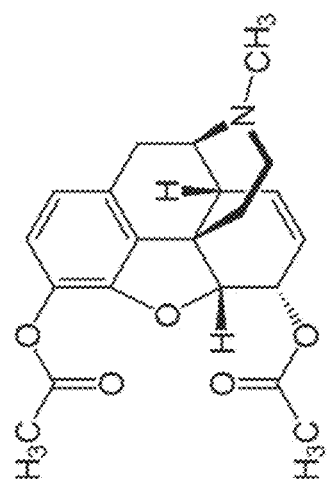
Figure 12:
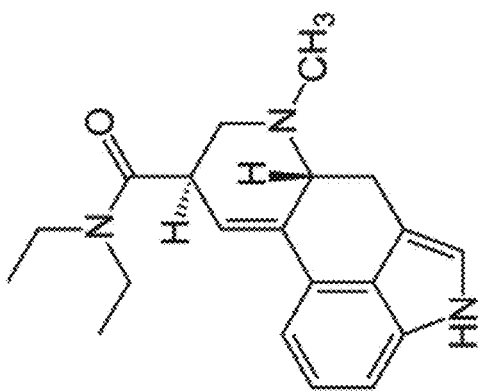
Figure 12:
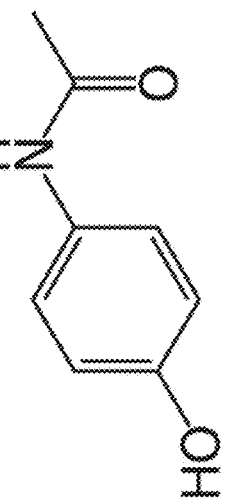
Figure 12:
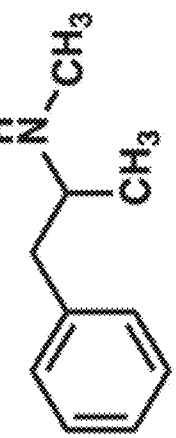

FIG. 12 shows multiple narcotic molecule structures for drug development and drug enforcement applications of the presently disclosed MRD system.

Figure 13:
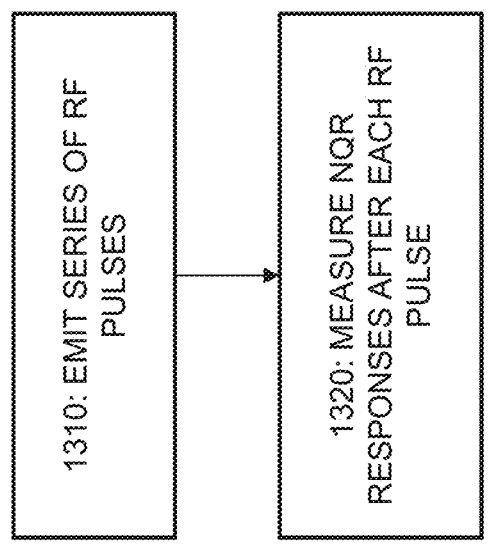

FIG. 13 is a process flow diagram illustrating an example method according to some of the presently disclosed embodiments.

DETAILED DESCRIPTION

The presently disclosed subject matter now will be described more fully hereinafter with reference to the accompanying drawings, in which some, but not all embodiments of the presently disclosed subject matter are shown. Like numbers refer to like elements throughout. The presently disclosed subject matter may be embodied in many different forms and should not be construed as limited to the embodiments set forth herein; rather, these embodiments are provided so that this disclosure will satisfy applicable legal requirements. Indeed, many modifications and other embodiments of the presently disclosed subject matter set forth herein will come to mind to one skilled in the art to which the presently disclosed subject matter pertains having the benefit of the teachings presented in the foregoing descriptions and the associated figures. Therefore, it is to be understood that the presently disclosed subject matter is not to be limited to the specific embodiments disclosed and that modifications and other embodiments are intended to be included within the scope of the appended claims.

In some embodiments, the presently disclosed subject matter provides a magnetic resonance detection (MRD) system for and methods of detecting and classifying multiple chemical substances. In one example, the presently disclosed MRD system and methods is based on nuclear quadrupole resonance (NQR) technology. Accordingly, an NQR detection system is provided for detecting and classifying various chemical substances. The NQR detection system can be used for detecting and classifying explosive substances, such as, but not limited to, nitrogen-based and/or oxygen-based explosives. In another example, the NQR detection system can be used for detecting and classifying narcotics and other drugs, such as, but not limited to, fentanyl, cocaine, morphine, heroin, methamphetamine, LSD, and paracetamol. In yet another example, the NQR detection system can be used for detecting and classifying kerogen. The detection and classification of kerogen may be useful, for example, in the oil and gas industry.

In another example, the presently disclosed MRD system and methods is based on nuclear magnetic resonance (NMR) technology.

In some embodiments, the presently disclosed MRD system provides a portable and fully contained NQR detection system.

In some embodiments, the presently disclosed MRD system (e.g., the NQR detection system) provides frequency agile operation for substantially full coverage of the explosive NQR spectrum using a broadband transmit/receive (T/R) switch (or duplexer) and a single multi-frequency radio frequency (RF) transducer. More particularly, the MRD system provides a frequency-agile system that can operate over a wide band of frequencies or wavelengths.

In some embodiments, the presently disclosed MRD system (e.g., the NQR detection system) utilizes a pulse sequence method that uses "frequency hopping" for detecting and classifying various chemical substances. Accordingly, the MRD system includes an NQR pulse sequence library and associated classification algorithms for the identification of, for example, a wide range of solid $^{14}N$ explosive substances. Further, the "frequency hopping" allows the MRD system to be wideband (or broadband) and therefore capable of detecting multiple substances more efficiently.

In some embodiments, the presently disclosed MRD system (e.g., the NQR detection system) utilizes a phase cycling method for reducing or substantially eliminating unwanted signals in the detected RF signal. Namely, the phase cycling method helps maximize the signal-to-noise ratio (SNR).

In some embodiments, the presently disclosed MRD system (e.g., the NQR detection system) provides a method of detecting and classifying various chemical substances that includes (1) pulse sequencing with "frequency hopping," (2) phase cycling for reducing or substantially eliminating unwanted signals, and/or (3) a process of mitigating amplitude modulation (AM) radio interference.

In some embodiments, the presently disclosed MRD system (e.g., the NQR detection system) provides improved RF transducer performance by reducing detection dwell time and increasing sensitivity.

In some embodiments, the multi-frequency RF transducer of the presently disclosed MRD system (e.g., the NQR detection system) includes certain frequency tuning and matching elements and typically a single coil (the antenna) that both transmits and receives. However, in other embodiments, the multi-frequency RF transducer includes separate transmit and receive coils or includes a transmit coil and a separate RF magnetometer of some type.

In some embodiments, the presently disclosed MRD system (e.g., the NQR detection system) provides single-frequency, narrowband operation for coverage of a certain portion of the explosive NQR spectrum using a narrowband T/R switch (or duplexer) and a single-frequency, narrowband RF transducer.

In one example of the presently disclosed MRD system and methods is provided that use NQR technology for detecting and classifying solid explosive substances in buried or concealed non-metallic housings and with a certain amount of standoff. For example, the presently disclosed MRD system is fully self-contained and includes spectrometer, power amplifier, and controller functions.

The low size, weight, and power (SWaP) 100W MRD system represents the first truly portable NQR-based sensor, with no comparable configuration available in the market. The portable RF system may be used to identify solid nitrogen-based explosives (e.g., ammonium nitrate, potassium nitrate, sodium nitrite, RDX, HMX, PETN, TNT, tetryl, urea nitrate, glycine), and/or solid oxygen-based explosives (e.g., TATP). This technology will detect these explosives regardless of mixture formulations or impurities, and can detect substances having minimum mass. The MRD system is also insensitive to the presence of metallic non-shielding clutter and will operate in substantially all soil types including high moisture content soils. The versatile modular arrangement enables depot inspections, laboratory analysis, or manual ground placement around shaped objects to augment other detection systems such as x-ray detection systems.

The MRD system technology comprises an auto-tuned, high-Q sensor head tethered to a high-efficiency transceiver chassis for broadband operation across the nitrogen ($^{14}N$) and oxygen ($^{17}O$) spectrum of interest. Innovative pulse sequences drive the duration of the applied RF pulse, RF pulse phase, and delay between pulse sequences to affect an NQR response producing strong, classifiable relaxation signatures. An enhancement that integrates small magnets into a handheld sensor head delivers a portable nuclear magnetic resonance (NMR) based capability that enables water content inspection.

Implementations maintain high system efficiency over the entire system bandwidth, mitigate external HF radio and impulse noise interference, and reduce system dwell/scan time. Innovative application of fast autotuning and automatching techniques to a portable NQR sensor, along with applying power amplifier drain modulation to an NQR variable power sweep, ensures optimum efficiency throughout. Digital filtering and noise cancellation achieve ample AM and impulse noise rejection. Advanced NQR pulse sequences, along with high transmit efficiency (due to autotuning and automatching) and signal detection earlier after the end of the pulse due to Q-spoiling, reduce dwell time.

NQR, which is related to nuclear magnetic resonance (NMR), is very mature with regards to understanding of the physics underlying the phenomenon. The NQR phenomenon is present in nuclear isotopes which have a nuclear spin greater than one-half, such as 14N, $^{17}O$, $^{35}Cl$, and $^{63}Cu$. Unfortunately, the hardware to conduct NQR experiments is limited to rack mount, non-portable equipment designed for running NMR experiments. One other hardware complication is that the NQR frequency range extends well below the typical NMR frequency ranges of interest, so procuring appropriate hardware for NQR experiments, even in a rack mounted format, is difficult. Consequently, there is a lack of commercial hardware for NQR detection applications.

The MRD system technology is a fully-contained NQR-based detection system. Additionally, FIG. 1 through FIG. 10 describe the technical approach of the MRD system as follows.

In the presence of an oscillating magnetic field oscillating at one of the atom's resonance frequencies, an atom with a nuclear quadrupole moment will be affected into an excited state. After the oscillating magnetic field is turned off, the presence of the atoms are detected as they relax back to equilibrium (see FIG. 1).

The detected NQR signal strength is proportional to the number of probed nuclei. NQR responses for $^{14}N$ fall within the 0.5-5 MHz lower HF band (see FIG. 7).

Many substances exhibit a response at more than one frequency and will have characteristic relaxation times back to equilibrium, producing unique signatures for classification.

The MRD system includes an innovative, RF transducer technology that generates an oscillating magnetic field to affect the nuclear quadrupole contained in solid nitrogen-based explosives and solid oxygen-based explosives having $^{14}N$ and $^{17}O$ atoms. The MRD system employs custom subsystems including a high efficiency RF amplifier, digital quadrature receiver, low noise front end, a high power transmit/receive (T/R) switch, and an innovative transducer to make standoff detection and classification measurements of these compounds.

The original MRD system hardware operates with a single-frequency (500 kHz or 3.6 MHz) RF amplifier and a fixed frequency transducer, producing near 100W RF output, and is battery operated. The integrated system fits into a 10"x0 8"x6" enclosure, with an external cabled transducer and common rechargeable BB-2590 military battery.

500 kHz, 1 MHz, and 3.6 MHz fixed frequency transducers have been built and tuned. In the MRD system effort, the system components were designed, constructed, and tested, and span three NQR frequencies of interest. Three transducers, two RF power amplifiers, and two T/R switches exist, and have been used to capture detection signatures in two of these three bands.

The tested MRD system demonstrates detection of buried sodium nitrite and buried ammonium nitrate. The pulse sequence for detection was implemented using a pulse generator, and was a single pulse followed by an acquisition. For single pulse NQR acquisitions the relative phase of the transmitter and receiver is switched after each pulse/acquisition in a phase alternating pair (PAP). An example of this order would be 0°, 180°, 90°, 270°. This PAP sequence is then repeated until a high enough SNR is reached for detection.

In the NQR signal detection of sodium nitrite, as well as the initial NQR signal intensity at standoffs from 0 to 2 cm, as expected, as the standoff is increased the signal strength decreases due to less sample being in the active volume of the coil. Detection was achieved with a single RF pulse, with no phase cycling or signal processing of the data. Increased standoff is achievable with a different configuration of the transducer, with increased power, or with phase cycling.

Referring now to FIG. 2A is a block diagram of an example of a MRD system that provides multi-frequency NQR operation. In this example, the capabilities of the MRD system are as follows: (1) achieve portable fully-contained NQR detection system, (2) deliver multi-frequency operation for substantially full coverage of explosive NQR spectrum without the need to swap single-frequency transducers, (3) expand the interrogative NQR pulse sequence library and associated classification algorithms for identification of all solid $^{14}N$ explosive substances, and (4) improve sensor performance by reducing detection dwell time and increasing sensitivity.

In the MRD system shown in FIG. 2A, subsystems exist including power amplifier, transmit and receive (T/R) switch, a transducer, a programmable source, and software.

In the MRD system shown in FIG. 2A, some components and subsystems exist in the original MRD system. The compact, rugged system (see FIG. 2A) delivers unambiguous NQR-based detection and classification.

NQR measurements with fixed-frequency RF transducers have been demonstrated. In the MRD system, a high-power, frequency-agile RF transducer is provided that is capable of operating across the 0.5-5 MHz band containing NQR responses for all the listed $^{14}N$ and $^{17}O$ based substances of interest. Fast autotuning/matching and rapid coil ringing suppression via Q-spoiling will enable querying for all the desired compounds, while minimizing detection and dwell time. Such an RF transducer is not currently available in a portable form factor.

The MRD system may include basic NQR pulse sequencing (see FIG. 8) or advanced NQR pulse sequencing (see FIG. 9). Current pulse sequencing using basic NQR pulse sequencing (see FIG. 8) provides detection and basic classification.

The MRD system may include advanced NQR pulse sequencing (see FIG. 9) and signal processing (see FIG. 10A, FIG. 10B, and FIG. 10C) to reduce detection dwell time and improve sensitivity. More sophisticated pulse sequencing delivers additional signatures such as relaxation times. Referring now again to FIG. 2A, the controller of the MRD system (see FIG. 3) includes an NQR pulse sequence library and associated classification algorithms for the identification of, for example, a wide range of solid $^{14}N$ explosive substances.

Using the multi-frequency and frequency-agile RF transducer (or sensor head) in conjunction with the improved pulse sequencing, an increased library of information on all the $^{14}N$ and $^{17}O$ based substances of interest is provided. A larger library of real-world data translates to increased capability and reliability of the MRD system.

A rugged MRD system may be operated remotely on an Unmanned Ground Vehicle (UGV). An example MRD system may meet the technical and operational specifications shown in Table 1, which shows the estimated technical and operational specifications for the MRD system. It should be understood that these example specifications are not intended to limit the presently disclosed invention in any way, but are instead illustrative.

TABLE 1

| Specification | Value | Units |
| --- | --- | --- |
| TECHNICAL | | |
| Frequency | 0.5-5 | MHz |
| RF Power | 100 | W |
| DC Supply Voltage | 28 | V |
| DC Supply Current, Standby | 0.2 | A |
| DC Supply Current, Operating | 2 | A |
| RMS DC Power, Operating | 42 | W |
| RMS Dissipated Power, Operating | 22 | W |
| Sensor Head Size | 6 × 12 × 2 | in. |
| Sensor Head Weight | 1 | lb. |
| Chassis Size | 9 × 8 × 7 | in. |
| Chassis Weight | 8 | lb. |
| Battery Type | BB-2590 | — |

TABLE 1-continued

| Specification | Value | Units |
| --- | --- | --- |
| OPERATIONAL | | |
| Continuous Run Time on Single Battery | 3.8 | hr. |
| Mission Run Time | 88 | hr. |
| Complete Cycle Time | 0.5-8 | min. |

Referring now to FIG. 4, more details of an example of the RF transducer of the MRD system shown in FIG. 2 are illustrated. Namely, the RF transducer is one of the electronic sub-systems of the MRD system. FIG. 4 shows a schematic diagram of the RF transducer. The RF transducer of the MRD system is a multi-frequency and frequency-agile RF transducer.

In FIG. 4, the schematic diagram of the RF transducer shows a loaded coil that is tuned to the desired NQR frequency and matched to the system characteristic impedance (e.g., 50 ohms) with automatic networks. A directional coupler and RF detectors provide forward and reverse RF power measurements for the tuning/matching algorithm. A Q-spoiling switch reduces ringing energy, enabling weaker NQR signal detection.

In this design, the sensor coverage is consolidated into a single innovative high-power, frequency-agile, RF transducer (see FIG. 4). Such a transducer is not commercially available in the NMR/NQR market. This unit will support a minimum of 100 W and provide frequency coverage spanning at least 0.5-3.6 MHz threshold, with 5 MHz objective. An additional feature is a transistor-based de-Qing or Q-spoiling network to rapidly damp out ringing after the transmit RF pulse is turned off, improving SNR.

Previous single-frequency tuned and matched transducers are high-Q and narrowband, since the untuned and unmatched bare coil has impedances ranging from $0.027\Omega$ to $0.65\Omega$ real and $4\Omega$ to $47\Omega$ imaginary over the near-decade frequency band of interest. Covering this inductive impedance range over the entire frequency band in a single RF transducer requires both automatic tuning (with a parallel variable capacitance) and automatic matching (with a series variable capacitance). Three methods are readily available for providing the required variable capacitance ranges at adequate voltage: relay-switched fixed binary-valued capacitor networks, motor-tuned vacuum variable capacitors, and high-power varactor diodes. All three methods can meet the requirements. Incorporating autotuning and automatching requires an input dual directional coupler and two RF power detectors (forward and reverse).

Relay-switched networks require sufficiently high-power relays, which are already common in commercial tuners. Relay networks also require a sufficiently large number of relays and capacitors to provide both the capacitance range and capacitance resolution required to tune and match required frequencies with sufficient accuracy. Motor-tuned vacuum variable capacitors are straightforward and common in commercial laboratory NMR applications, but do suffer from SWaP-C disadvantages of both motor and vacuum variable size and weight, motor power consumption, and vacuum variable cost (at least for domestic suppliers). Such tuners are also typically slow. High power varactor diodes require bias tee and voltage driver circuits that can be isolated from the transducer to a high degree. A relay-based tuning and matching network is provided, with motor-driven vacuum variables and/or high-power varactors as contingencies.

Immediately after the turn-off portion of a high-power RF pulse driving an inductive load such as a coil, the receiver sees a damped oscillatory waveform (ringing). Since tuned and matched small coils at low frequencies have unavoidably high Q, ringing will always be present. Increasing Q results in increased ringing. During the decay envelope of this ringing, the receiver is swamped by this natural frequency and cannot distinguish the NQR signal. Placing a fast-shorting switch to drop a resistance across the coil terminals "spoils" the coil Q and rapidly damps out the ringing. The receiver can thus use the earlier, stronger, previously inaccessible portion of the NQR signal, improving SNR and dynamic range.

FIG. 5A and FIG. 5B show more details of an example of the power amplifier of the MRD system shown in FIG. 2. Namely, the power amplifier is another of the electronic sub-systems of the MRD system. FIG. 5A shows a high-level block diagram of the power amplifier, and FIG. 5B shows a schematic diagram of the power amplifier.

The architecture of the power amplifier is a simplified version of envelope tracking applied to a push-pull broadband RF power amplifier, Class-E version. The Class AB version is nearly identical at this level of detail.

The MRD system design has single-band Class-E high-efficiency RF power amplifiers, which are switch-mode RF amplifiers suitable for constant-envelope (constant RF output power) pulse sequences. However, in the MRD system shown in FIG. 2, the design of these power amplifiers is extended in two ways: (1) by broadening the bandwidth and (2) by implementing envelope tracking (ET) to enable variable RF power output. Low-SWaP RF amplifiers meeting these NQR-specific requirements are not commercially available.

A broadband (0.5-5 MHz) high power (75-100 W) linear RF amplifier using LDMOS RF power transistors is provided. This amplifier topology will be push-pull, though single-ended is still viable as the magnetic component requirements may be simpler. This amplifier will be either Class E or Class AB; at this low but wide frequency band, there is not a clear winner: at wide bandwidths, the tradeoff is highly dependent on specific device parameters and their degree of nonlinearity over both frequency and device terminal voltages. In either case, envelope tracking (varying the transistor drain voltage to vary the output power while maintaining high efficiency) will maintain high efficiency at lower output power levels (see FIG. 5A). Envelope tracking requires a drain modulator circuit that has sufficient RF bandwidth to vary the drain voltage in step with the input waveform. The frequency of operation is low enough to support a straightforward drain modulator implementation based on simple RF detection and switching transistor drain control. At this low frequency band, this architecture will deliver power, bandwidth, and efficiency suitable for a portable NQR system.

The core of the power amplifier in this example is two LDMOSFETs in push-pull. Critical components are the transistors Q1 and Q2, the input and output baluns $T_1$ and $T_2$, and the Class E resonant network inductors L5 and L6. Many suitable FETs exist; low gate capacitance, high switching speed, and high drain breakdown voltage are the main specifications of interest. The transformers and inductors require cores with sufficiently high relative permeability μr for low frequency operation, and of sufficient size to prevent core saturation and heating. Is a simplified schematic that omits many of the biasing details, and is a Class E topology. C1/L5 and C2/L6 are the primary Class-E resonant circuit components; however, the components could be changed to a suitable impedance matching low-pass topology for Class AB operation, and the gate bias voltage would also change slightly.

FIG. 6A and FIG. 6B illustrate more details of an example of the transmit/receive (T/R) switch of the MRD system shown in FIG. 2A. Namely, the T/R switch is yet another of the electronic sub-systems of the MRD system. The T/R switch is also called the duplexer. FIG. 6A shows a high-level block diagram of the T/R switch. FIG. 6B shows a schematic diagram of the T/R switch.

The T/R switch is an innovative broadband, high power (100 W capable), low-loss, small volume T/R switch, in some embodiments. Switching high RF power levels at very low frequencies requires the DC equivalent of the peak RF voltage, applied to PIN diodes with both thick intrinsic I layers and high breakdown voltage. Applying this approach to NMR/NQR switching allows the replacement of large lengths of quarter-wave-length, lossy, coaxial cable networks operating at a single frequency with a compact, broadband, low-loss solid-state switch. This T/R switch may be PIN-diode based, with an onboard high voltage (~100V) boost converter, and custom high voltage isolated switching logic.

RF source—Integrated direct digital synthesis (DDS)-based signal generators output highly programmable waveforms, including high-speed chirps and other modulation formats, with quadrature outputs suitable for an IQ receiver architecture. DDS is a method of producing an analog waveform—usually a sine wave—by generating a time-varying signal in digital form and then performing a digital-to-analog conversion. These generators combine a clock generator, DDS device, RF reconstruction filtering and signal conditioning, and microprocessor control and interface into a compact, versatile, low-power-requirement signal source. The DDS quadrature phase enables phase cycling to greatly improve SNR.

Referring now to FIG. 7 is a plot showing the resonance frequencies of, for example, several nitrogen-based explosive substances of interest. NQR spectrum acts as a molecular fingerprint. Classification can typically be done through excitation of isolated NQR frequencies. The detected NQR signal strength is proportional to the number of probed nuclei. Most of the NQR responses for $^{14}$N fall within the 0.5-5 MHz lower HF band.

Referring now to FIG. 8 and FIG. 9, the MRD system shown in FIG. 2 uses pulse sequences to generate a target response. Pulse sequences are the combination of RF pulses (including pulse length and phase) and delays that make up an NQR experiment. The simplest NQR pulse sequence consists of a single pulse (see FIG. 8), while more complex sequences may involve hundreds or thousands of pulses (see FIG. 9). The pulse sequence is said to be 'encoded' for the physical effect being observed such as transverse or longitudinal relaxation, which allow classification of materials being measured.

As seen in FIG. 9, a pulse sequence may comprise multiple phase groups, with the pulses in each phase group having a different phase relative to the pulses in the other groups. The phase groups may thus include one or more phase-alternating pairs, e.g., where the second phase group in a pair has a phase offset of 180 degrees relative to the phase of the first group in the pair. In the illustrated example, each phase group has a single pulse at each of M frequencies, although in some cases there may be more than one pulse at each frequency. In the latter cases, the second pulse and any immediately succeeding pulses at any given frequency may have phases that are orthogonal to a phase of the first pulse at the given frequency The pulse sequence shown in FIG. 9 may comprise a single scan, in some embodiments, which may be repeated multiple times. The pulse sequence shown in FIG. 9 may be understood as a multi-dimensional pulse sequence.

The delay between one pulse at a given frequency and a succeeding pulse at a second frequency may be shorter than a relaxation time corresponding to the given frequency, in some embodiments, thus allowing the pulse sequence to be shortened so that the only delays between pulses are those required for re-tuning the apparatus and adjusting any filters. Advantageously, the difference in frequency between adjacent pulses at different frequencies is such that the first pulse does not cause any excitation at the frequency of the second pulse.

While the pulses in the pulse sequence may have uniform lengths, this is not necessary—some embodiments may utilize different pulse lengths, whether between frequencies or within a frequency.

Free induction decay—The simplest NQR experiment involves a single RF pulse. This pulse rotates the magnetization vector into the transverse plane. For experiments involving a single RF pulse, the length of the pulse is typically chosen so that it rotates the magnetization 90° from the longitudinal direction. This pulse length depends on the targeted substance, and may range from 10 microseconds, for example, to 100-200 microseconds, for example. This angle gives the largest receivable signal intensity after the RF pulse, though other pulse lengths will still produce a signal. After the RF pulse rotates the magnetization vector into the transverse plane its magnitude will evolve as:

$$|\vec{M}(t)| = M_0 e^{-t/T^*_2}$$

That is, the magnetization vector will rotate back to the equilibrium direction, with the spin coherence dephasing at a rate of $T^*_2$. This detected signal is referred to as the Free Induction Decay (FID).

Spin echo and QCPMG—The spin echo pulse sequence technique allows the magnetization lost through time-independent magnetic field inhomogeneities to be regained. Examples of these inhomogeneities include heteronuclear couplings and the chemical shift. The spin echo will not refocus the loss of spin coherence brought about from entropy.

The spin echo experiment starts with a 90° pulse that rotates the magnetization vector into the x-y plane, followed by the spins dephasing due to inhomogeneities in the magnetic field. A 180° pulse applied at a time r will invert the phase of each spin such that the spins will refocus and produce a signal (the spin echo) which reaches maximum intensity at time 2τ. By changing the value of $T_2$ can be measured.

The quadrupolar Carr-Purcell-Meiboom-Gill (QCPMG) pulse sequence extends the idea of the spin echo pulse sequence. In the spin echo experiment, after the spins are refocused, they begin to dephase again. By applying another 180° pulse at a time which satisfies t<$T_2$ the magnetization can be refocused, and by applying a chain of 180° pulses a continual refocusing of the magnetization vector occurs until the spins are completely dephased. The long series of echoes is referred to as an echo train, and the intensity of the $N^{th}$ echo in the train at a time $t_E$ is given by:

$$M(t) = M_0 e^{-Nt_E/T_2}$$

The QCPMG pulse sequence allows faster measurement of $T_2$ than the spin echo method. Referring now to FIG. 10A, the QCPMG pulse sequence excites multiple spin echoes at times $t=Nt_E$ modulated by a $T_2$ relaxation envelope.

Inversion recovery—The inversion recovery pulse sequence is the most common way of measuring the longitudinal relaxation time, $T_1$. The inversion recovery pulse sequence begins with a 180° pulse which rotates the magnetization vector so that it lies in the negative z direction. The magnetization is then allowed to relax for a time τ at which point a 90° pulse is applied, which rotates the magnetization into the transverse plane where it can be detected. The intensity of the magnetization as a function of time is given by:

$$M(t) = M_0(1 - 2e^{-\tau/T_1})$$

The inversion recovery is performed using a range of τ values, and the $T_1$ relaxation curve is the intensity of the acquired signal plotted as a function of τ.

Classification Technique—Classification for materials using NQR may not be possible using spectroscopy alone due to the close resonance frequencies and broad overlapping spectral features of different materials. Instead, classification should be done through either $T_2$ and/or $T_1$ relaxation times. Correlation of spectral and relaxation times may also be possible.

It is also possible to classify mixtures of materials using their relaxation times by finding distribution of relaxation times. In the case of a distribution of $T_1$ and $T_2$ relaxation times, f(τ), the normalized magnetization as a function of time can be written:

$$m(t) = \frac{M(t)}{M(0)} = \int_0^\infty (1 - 2e^{\tau/T_1}) f(\tau) e^{\tau/T_2} d\tau$$

This is a Fredholm integral of the first kind with two kernels. This is an ill-posed problem, and regularization is required to calculate a stable solution. Two forms of regularization are used to solve this ill-posed problem. The first method is to use truncated singular value decomposition (TSVD), which has the added benefit of compressing the data, so the computational effort is significantly less. The second method used in conjunction with the TSVD is Tikhonov regularization, which is a damped least squares method.

The calculation briefly described above has the effect of transforming the measured NQR relaxation data (either $T_1$, $T_2$, or $T_1$ correlated with $T_2$) from the experimental time dimension into the relaxation time dimension. Referring now to FIG. 10B and FIG. 10C, FIG. 10B shows an example of simulated QCPMG relaxation data with two relaxation components and FIG. 10C shows its corresponding $T_2$ distribution.

Physical Configuration—Conceptual design models of a rugged lightweight chassis and sensor head are presented. Physical housing must consider the end use case to achieve optimal reliability, performance, and especially ease of use. Typical important features are user interface, weight, size, cooling needs, location of service, serviceability, and ruggedness.

The architecture and configuration of a modular MRD system enables adaptability to multiple platforms. Manual placement as a package sensor, installation as a robot payload, and usage as a tabletop analyzer all can be accommodated. Operational control can be directed by a control panel on the electronics chassis, via a dedicated radio link, or through a robot network.

The MRD system may include a digital port to provide development and test access, and to support future digitalenabled radio control. The MRD system architecture can incorporate communication protocols to connect with radios.

Applications for detection and classification of substances—While the MRD system can be used for detecting and classifying explosive substances, such as, but not limited to, nitrogen-based and/or oxygen-based explosives, other applications are possible. Referring now to FIG. 11A, FIG. 11B, and FIG. 12 is examples of other applications of the MRD system.

In one application example, the MRD system can be used for detecting and classifying narcotics and other drugs(see FIG. 12), such as, but not limited to, fentanyl, cocaine, morphine, heroin, methamphetamine, LSD, and paracetamol. Since most narcotics contain nitrogen, the MRD system can provide the ability to detect and classify contraband drugs in a form factor which is easily transported in police vehicles. Agencies, such as TSA, LEA, FBI, and the Coast Guard, will benefit from quick, on-site analysis without sending samples to a central laboratory. The MRD system could also be situated in vehicles, prisons, schools, hospitals, mail facilities, and other public venues.

In the same vein as narcotics detection, pharmaceutical development companies could benefit from the MRD system. Many drugs, whether they are narcotics or not, contain nitrogen. As part of the FDA approval process, pharmaceutical companies need to provide proof that the molecules they are manufacturing is what they say they are making, as well as quality control measurements along the manufacturing chain. One common quality control measurement technique is NMR. $^1$H and $^{13}$C NMR measurements give structural information about organic molecules. NMR experiments are done using a large superconducting magnet, which has a high maintenance cost. In nitrogen containing molecules, NQR could be used as a quality control measurement due to the dependence of the NQR resonance frequency to a specific molecule. NQR could be a cheap, easy to run test for chirality of the molecule being tested to help bolster the NMR data.

In another application example, the MRD system can be used for detecting and classifying kerogen (see FIG. 11A). The detection and classification of kerogen may be useful, for example, in the oil and gas industry (see FIG. 11B). The source of hydrocarbons in formation indicate (1) the age of formation, (2) what type of hydrocarbons are present, and (3) the production viability of the well.

FIG. 13 is a process flow diagram illustrating an example method for performing magnetic resonance according to some of the techniques described herein. As discussed above, this method provides for rapid detection of solid substances which contain nuclei with quadrupole moments with known or unknown resonance frequencies. The method comprises, as shown at block 1310, emitting a series of RF pulses. The method continues, as shown at block 1320, with measuring NQR responses after each RF pulse.

The series of RF pulses may have any of the characteristics described above. For example, the series of RF pulses may comprise a first phase group of pulses, the first phase group comprising at least one pulse for each of a plurality of frequencies, and a second phase group at a second phase differing from a first phase for the first phase group, the second phase group comprising at least one pulse for each of the plurality of frequencies. In these embodiments, the method may further comprise, for each of the plurality of frequencies, coherently adding the measured NQR responses corresponding to the pulses for the respective frequency.

Some embodiments of this method may thus comprise applying a multi-dimensional nuclear quadrupole resonance pulse sequence to a substance, where the multi-dimensional pulse sequence comprises a first phase group of pulse sequences applied at a plurality of frequencies, and a second phase group of pulse sequences of applied at a plurality of frequencies, such that the first and second phase groups form a phase-alternating-pair, and detecting a response signal at each of the plurality of frequencies during the first and second phase groups.

The length of the RF pulses applied for each of a plurality of frequencies within the phase group may be the same or different. In some embodiments, the time between the pulse sequences at each of a plurality of frequencies within a phase group may be determined by the amount of time it takes to tune the probe to a new frequency.

In some embodiments, the pulse sequences applied for each of a plurality of frequencies within the phase group have one or more RF pulses; if more than one RF pulse is applied in the pulse sequence the second and any following pulses have a phase that is orthogonal to the first RF pulse applied.

In various embodiments, the length of the first and second RF pulses applied in a pulse sequence for each of a plurality of frequencies may be the same or different. In some embodiments, the excitation frequencies between successive RF pulses applied at a plurality of frequencies within a phase group are different enough that RF pulses applied within a group will not excite the frequency of the next set of applied RF pulses.

Following long-standing patent law convention, the terms "a," "an," and "the" refer to "one or more" when used in this application, including the claims. Thus, for example, reference to "a subject" includes a plurality of subjects, unless the context clearly is to the contrary (e.g., a plurality of subjects), and so forth.

Throughout this specification and the claims, the terms "comprise," "comprises," and "comprising" are used in a non-exclusive sense, except where the context requires otherwise. Likewise, the term "include" and its grammatical variants are intended to be non-limiting, such that recitation of items in a list is not to the exclusion of other like items that can be substituted or added to the listed items.

For the purposes of this specification and appended claims, unless otherwise indicated, all numbers expressing amounts, sizes, dimensions, proportions, shapes, formulations, parameters, percentages, quantities, characteristics, and other numerical values used in the specification and claims, are to be understood as being modified in all instances by the term "about" even though the term "about" may not expressly appear with the value, amount or range. Accordingly, unless indicated to the contrary, the numerical parameters set forth in the following specification and attached claims are not and need not be exact, but may be approximate and/or larger or smaller as desired, reflecting tolerances, conversion factors, rounding off, measurement error and the like, and other factors known to those of skill in the art depending on the desired properties sought to be obtained by the presently disclosed subject matter. For example, the term "about," when referring to a value can be meant to encompass variations of, in some embodiments ±100%, in some embodiments ±50%, in some embodiments ±20%, in some embodiments ±10%, in some embodiments ±5%, in some embodiments ±1%, in some embodiments ±0.5%, and in some embodiments ±0.1% from the specified amount, as such variations are appropriate to perform the disclosed methods or employ the disclosed compositions.

Further, the term "about" when used in connection with one or more numbers or numerical ranges, should be understood to refer to all such numbers, including all numbers in a range and modifies that range by extending the boundaries above and below the numerical values set forth. The recitation of numerical ranges by endpoints includes all numbers, e.g., whole integers, including fractions thereof, subsumed within that range (for example, the recitation of 1 to 5 includes 1, 2, 3, 4, and 5, as well as fractions thereof, e.g., 1.5, 2.25, 3.75, 4.1, and the like) and any range within that range.

Although the foregoing subject matter has been described in some detail by way of illustration and example for purposes of clarity of understanding, it will be understood by those skilled in the art that certain changes and modifications can be practiced within the scope of the appended claims.

What is claimed is:

1. A magnetic resonance detection apparatus, comprising:
   a frequency-tunable transducer circuit comprising a coil and a tuning network;
   a transmit/receive switch circuit having a common port coupled to the frequency-tunable transducer circuit and having a multi-octave operating bandwidth;
   a transmitter circuit coupled to an input port of the transmit/receive switch circuit, the transmitter circuit comprising a power amplifier with a multi-octave operating bandwidth;
   a digital quadrature receiver circuit coupled to an output port of the transmit/receive switch circuit and having a multi-octave operating bandwidth;
   a tunable frequency source coupled to the transmitter circuit and to the receiver circuit, the tunable frequency source having a multi-octave operating bandwidth; and
   a controller circuit configured to control the frequency source, the transmitter circuit, and the transmit/receive switch so as to emit a series of radio-frequency (RF) pulses from the coil and further configured to control the frequency source, the receiver circuit and the transmit/receive switch so as to measure nuclear quadrupole resonance (NQR) responses after each RF pulse.

2. The magnetic resonance detection apparatus of claim 1, wherein the controller circuit is configured to control the frequency source, the transmitter circuit, and the transmit/receive switch so as to emit a pulse sequence of radio-frequency (RF) pulses comprising a first phase group of pulses, the first phase group comprising at least one pulse for each of a plurality of frequencies, and a second phase group at a second phase differing from a first phase for the first phase group, the second phase group comprising at least one pulse for each of the plurality of frequencies, wherein the controller circuit is further configured to, for each of the plurality of frequencies, coherently add the measured NQR responses corresponding to the pulses for the respective frequency.

3. The magnetic resonance detection apparatus of claim 2, wherein each of the first and second phase groups comprises more than one pulse at each of the plurality of frequencies.

4. The magnetic resonance detection apparatus of claim 2, wherein, in each phase group, each delay between a pulse at a given frequency and a succeeding pulse at a different frequency is shorter than a transverse relaxation time or longitudinal relaxation time for responses corresponding to the given frequency.

5. The magnetic resonance detection apparatus of claim 2, wherein the first and second phase groups form a phase-alternating-pair.

6. The magnetic resonance detection apparatus of claim 1, wherein the controller circuit is further configured to estimate an effective transverse relaxation time, and/or a transverse relaxation time, and/or a longitudinal relaxation time for responses corresponding to at least one RF pulse frequency.

7. The magnetic resonance detection apparatus of claim 6, wherein the controller circuit is configured to estimate an effective transverse relaxation time, and/or a transverse relaxation time and/or a longitudinal relaxation time for responses corresponding to each of at least two RF pulse frequencies, and to compare the estimated longitudinal relaxation times and/or transverse relaxation times to each of a plurality of stored patterns, to identify a closest match.

8. The magnetic resonance detection apparatus of claim 1, wherein the frequency-tunable transducer circuit further comprises a Q-spoiling switch having an input coupled to the coil and an output connected to ground, and wherein the controller circuit is further configured to close the Q-spoiling switch for a predetermined time interval between the emitting of each pulse and the subsequent measuring of the response.

9. The magnetic resonance detection apparatus of claim 1, wherein the transmit/receive switch, the transmitter circuit, the digital quadrature receiver circuit, and the frequency source operate at frequencies spanning at least 500 kHz — 4 MHz.

10. The magnetic resonance detection apparatus of claim 1, further comprising one or more RF detectors coupled to the transducer circuit via a directional coupler, and wherein the controller circuit is configured to adjust the tuning network of the frequency-tunable transducer circuit based on outputs of the one or more RF detectors during transmitted pulses.

11. A method for performing magnetic resonance detection, the method comprising:
   emitting a series of radio-frequency (RF) pulses, wherein the series of RF pulses comprises a first phase group of pulses, the first phase group comprising at least one pulse for each of a plurality of frequencies, and a second phase group at a second phase differing from a first phase for the first phase group, the second phase group comprising at least one pulse for each of the plurality of frequencies;
   measuring nuclear quadrupole resonance (NQR) responses after each RF pulse; and,
   for each of the plurality of frequencies, coherently adding the measured NQR responses corresponding to the pulses for the respective frequency.

12. The method of claim 11, wherein each of the first and second phase groups comprises more than one pulse at each of the plurality of frequencies.

13. The method of claim 12, wherein the second pulse and any immediately succeeding pulses at any given frequency has a phase that is orthogonal to a phase of the first pulse at the given frequency.

14. The method of claim 11, wherein, in each phase group, each delay between a pulse at a given frequency and a succeeding pulse at a different frequency is shorter than a transverse relaxation time or longitudinal relaxation time for responses corresponding to the given frequency.

15. The method of claim 11, wherein the first and second phase groups form a phase-alternating-pair.

16. The method of claim 11, wherein the difference between frequencies for any pair of succeeding pulses with different frequencies is large enough that the first pulse of the pair will not excite the frequency of the second pulse of the pair.

17. The method of claim 11, wherein the method comprises estimating an effective transverse relaxation time, and/or a transverse relaxation time, and/or a longitudinal relaxation time for responses corresponding to at least one RF pulse frequency.

18. The method of claim 17, wherein the method comprises estimating an effective transverse relaxation time, and/or a transverse relaxation time and/or a longitudinal relaxation time for responses corresponding to each of at least two RF pulse frequencies, and comparing the estimated longitudinal relaxation times and/or transverse relaxation times to each of a plurality of stored patterns to identify a closest match.

* * * * *